(12) United States Patent
Ren et al.

(10) Patent No.: US 11,011,645 B2
(45) Date of Patent: May 18, 2021

(54) THIN FILM TRANSISTOR AND MANUFACTURING METHOD THEREOF, ARRAY SUBSTRATE AND DISPLAY DEVICE

(71) Applicant: BOE Technology Group Co., Ltd., Beijing (CN)

(72) Inventors: Qingrong Ren, Beijing (CN); Guangcai Yuan, Beijing (CN); Feng Guan, Beijing (CN); Dongsheng Li, Beijing (CN); Jianming Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/446,744

(22) Filed: Jun. 20, 2019

(65) Prior Publication Data
US 2020/0013902 A1    Jan. 9, 2020

(30) Foreign Application Priority Data
Jul. 6, 2018    (CN) .......................... 201810738924.X (51) Int. Cl.
*H01L 29/786* (2006.01)
*H01L 29/24* (2006.01)
*H01L 29/66* (2006.01)

(52) U.S. Cl.
CPC ........ *H01L 29/78681* (2013.01); *H01L 29/24* (2013.01); *H01L 29/66969* (2013.01)

(58) Field of Classification Search
CPC ............... H01L 29/78681; H01L 29/24; H01L 29/66969; H01L 29/78618; H01L 29/45; H01L 29/66742

USPC ............. 257/43, 66, 327, 414, 773, E21.09, 257/E21.071, E29.255; 438/48, 102, 478
See application file for complete search history.

(56) References Cited

U.S. PATENT DOCUMENTS 7,994,593 B2 *   8/2011   Takulapalli ........ G01N 27/4145
                                                              257/414
2004/0089874 A1   5/2004   Negami et al.
(Continued)

FOREIGN PATENT DOCUMENTS

CN           1499649 A      5/2004
CN         105261636 A      1/2016
(Continued)

OTHER PUBLICATIONS

First office action of Chinese application No. 201810738924.X dated Nov. 28, 2019.
(Continued)

*Primary Examiner* — Dao H Nguyen
(74) *Attorney, Agent, or Firm* — Fay Sharpe LLP (57) ABSTRACT

The present disclosure discloses a thin film transistor and a manufacturing method thereof, an array substrate and a display device, and belongs to the field of semiconductor display technology. The active layer of the thin film transistor is made of a CIGS material. By manufacturing the active layer of the thin film transistor with the CIGS material, and the crystal defects of the CIGS are less than LTPS and IGZO, the mobility of the thin film transistor is higher, and the switching speed of the thin film transistor is faster, thereby being advantageous to further improve the resolution of the display device.

17 Claims, 10 Drawing Sheets

(56) References Cited

U.S. PATENT DOCUMENTS

| | | | | |
|---|---|---|---|---|
| 2010/0261304 A1* | 10/2010 | Chang | ............... | H01L 21/02554 |
| | | | | 438/72 |
| 2013/0140649 A1* | 6/2013 | Rogers | .............. | H01L 29/78696 |
| | | | | 257/414 |
| 2016/0359061 A1* | 12/2016 | Chaudhari | .......... | H01L 31/0725 |
| 2017/0200746 A1 | 7/2017 | Su et al. | | |
| 2017/0294544 A1 | 10/2017 | Hsin | | |

FOREIGN PATENT DOCUMENTS

| | | |
|---|---|---|
| CN | 105576038 A | 5/2016 |
| KR | 20090043264 A | 5/2009 |

OTHER PUBLICATIONS

Second office action of Chinese application No. 201810738924.X dated Aug. 4, 2020.

Junfeng Han, Thin Film Compound Solar Cells; Sep. 30, 2017, pp. 82-85.

Yu-Jen Hsiao, et al, Bifacial CIGS (11 % Efficiency)/Si Solar Cells by Cd-free and Sodium-free Green Process Integrated with CIGS TFTs; Dec. 7, 2011, p. IEDM11-864-p. IEDM11-867, figures 1, 2, 7.

* cited by examiner

THIN FILM TRANSISTOR AND MANUFACTURING METHOD THEREOF, ARRAY SUBSTRATE AND DISPLAY DEVICE

CROSS-REFERENCE TO RELATED APPLICATION

This application claims priority to Chinese Patent Application No.: 201810738924.X, filed on Jul. 6, 2018 and entitled "THIN FILM TRANSISTOR AND MANUFACTURING METHOD THEREOF, ARRAY SUBSTRATE AND DISPLAY DEVICE", the entire contents of which are incorporated herein by reference.

TECHNICAL FIELD

The present disclosure relates to the field of semiconductor display technology, and in particular, to a thin film transistor and a manufacturing method thereof, an array substrate and a display device.

BACKGROUND

The thin film transistor (TFT) is an indispensable component in liquid crystal display device and organic light-emitting diode display device.

The higher the mobility of the thin film transistor is, the faster the switching speed of the thin film transistor is. The faster the switching speed, the more favorable to improve the resolution of the display device. The mobility of the thin film transistor is mainly affected by the active layer of the thin film transistor.

SUMMARY

The embodiments of the present disclosure provide a thin film transistor and a manufacturing method thereof, an array substrate and a display device.

The embodiments of the present disclosure provide a thin film transistor, and an active layer of the thin film transistor is made of a Cu—In—Ga—Se (CIGS) material.

Optionally, the active layer of the thin film transistor comprises a source electrode contact region in contact with a source electrode, a drain electrode contact region in contact with a drain electrode, and an active region connecting the source electrode contact region and the drain electrode contact region; and a copper content and a selenium content of the source electrode contact region, the drain electrode contact region and the active region are all equal.

Optionally, the active layer of the thin film transistor comprises a source electrode contact region in contact with a source electrode, a drain electrode contact region in contact with a drain electrode, and an active region connecting the source electrode contact region and the drain electrode contact region; a selenium content of the source electrode contact region and a selenium content of the drain electrode contact region are less than a selenium content of the active region; and a copper content of the source electrode contact region, the drain electrode contact region and the active region are all equal.

Optionally, the active layer of the thin film transistor comprises a source electrode contact region in contact with a source electrode, a drain electrode contact region in contact with a drain electrode, and an active region connecting the source electrode contact region and the drain electrode contact region; a copper content of the source electrode contact region and a copper content of the drain electrode contact region are greater than a copper content of the active region; and a selenium content of the source electrode contact region, the drain electrode contact region and the active region are all equal.

Optionally, both the source electrode and the drain electrode contain copper.

Optionally, both the source electrode and the drain electrode are made of one of the following materials: copper, a copper alloy, and a copper-based composite material.

Optionally, a gate electrode of the thin film transistor is made of one of the following materials: copper, aluminum, titanium, molybdenum or a molybdenum-based composite material.

The embodiments of the present disclosure provide a manufacturing method for a thin film transistor, and the method comprises:

forming a CIGS film layer on a substrate; and patterning the CIGS film layer to obtain an active layer.

Optionally, the active layer comprises a source electrode contact region, a drain electrode contact region, and an active region connecting the source electrode contact region and the drain electrode contact region; and the manufacturing method further comprises:

forming a source electrode and a drain electrode on the active layer, part of the region of the source electrode covering on the source electrode contact region, and part of the region of the drain electrode covering on the drain electrode contact region; and selenizing the active region.

Optionally, the active layer comprises a source electrode contact region, a drain electrode contact region, and an active region connecting the source electrode contact region and the drain electrode contact region; and the manufacturing method further comprises:

forming a source electrode and a drain electrode on the active layer, the source electrode and the drain electrode containing copper, part of the region of the source electrode covering on the source electrode contact region, and part of the region of the drain electrode covering on the drain electrode contact region; and annealing the substrate on which the source electrode and the drain electrode are formed, so that the copper in the source electrode diffuses to the source electrode contact region and the copper in the drain electrode diffuses to the drain electrode contact region.

Optionally, the annealing temperature of the annealing treatment is 400° C. to 600° C.

Optionally, the manufacturing method further comprises:

selenizing the active layer before the source electrode and the drain electrode are formed on the active layer.

The embodiments of the present disclosure further provide an array substrate, and the array substrate comprises any one of the above thin film transistor.

The embodiments of the present disclosure further provide a display device, and the display device comprises the above array substrate.

DETAILED DESCRIPTION

To present the principles and advantages of the present disclosure more clearly, embodiments of the present disclosure will be described in further detail in combination with the accompanying drawings.

In the related art, the active layer of the thin film transistor is generally made of IGZO (indium gallium zinc oxide) or LTPS (Low Temperature Poly-silicon). The mobility of the thin film transistor made of the IGZO is generally 3-15 $cm^2 \cdot V^{-1} \cdot s^{-1}$. The mobility of the thin film transistor made of the LTPS can reach 50-200 $cm^2 \cdot V^{-1} \cdot s^{-1}$. However, with the development of the display technology, the performances of such two types of thin film transistors are difficult to meet the needs of production.

The embodiments of the present disclosure provide a thin film transistor. The active layer of the thin film transistor is made of a Cu—In—Ga—Se (CIGS) material. Optionally, the thin film transistor can be a thin film transistor of a top gate structure, or a thin film transistor of a bottom gate structure, or a thin film transistor of a double-gate structure.

Figure 1:
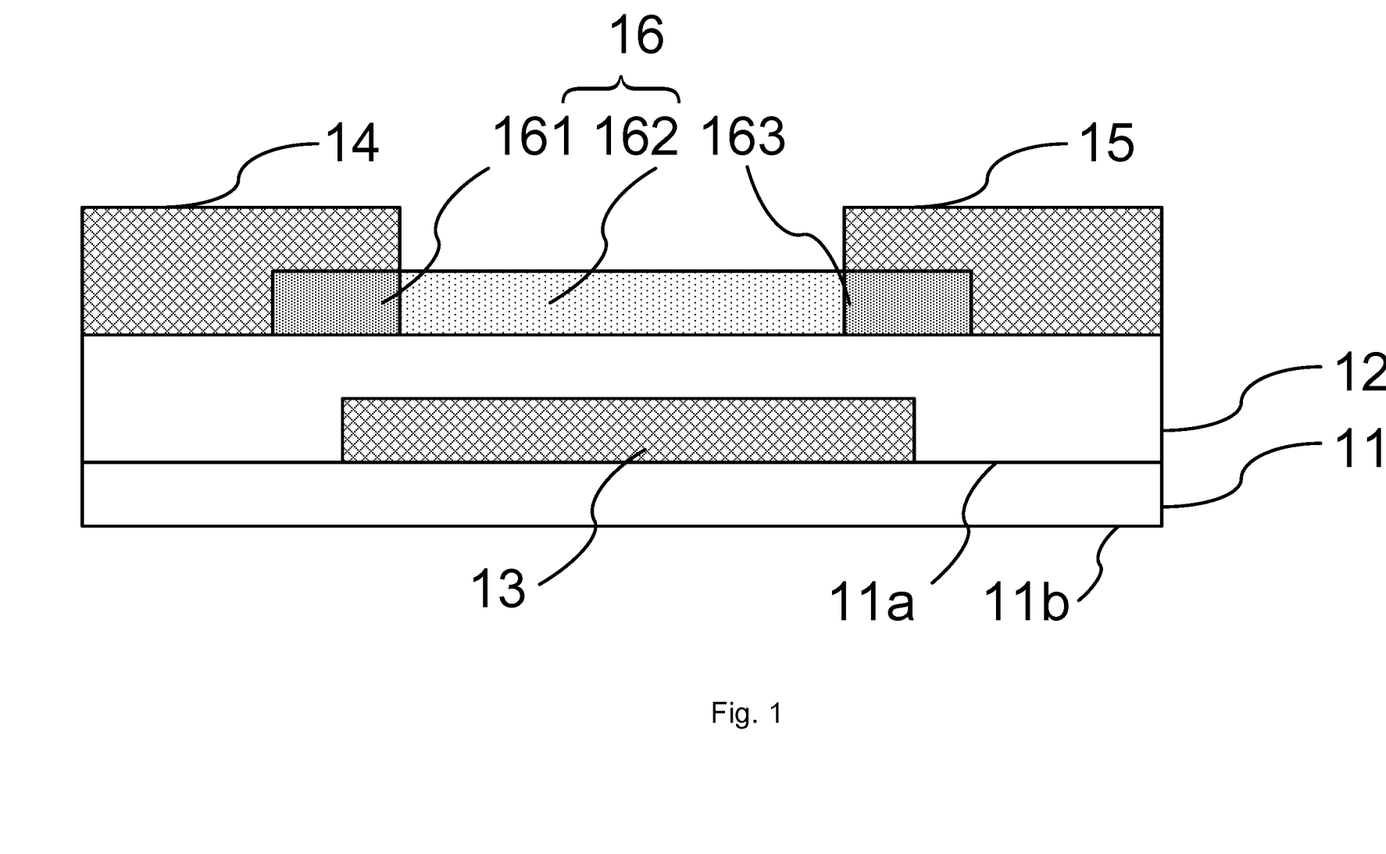
FIG. 1 is a schematic structural diagram of a thin film transistor according to the embodiments of the present disclosure.

FIG. 1 is a schematic structural diagram of a thin film transistor according to the embodiments of the present disclosure. The thin film transistor is disposed on a substrate 11 and includes a gate electrode 13, an active layer 16, a source electrode 14, and a drain electrode 15. As shown in FIG. 1, the substrate 11 has a first surface 11a and a second surface 11b which are opposite to each other. Wherein, the gate electrode 13 is disposed on the first surface 11a of the substrate 11.

As shown in FIG. 1, a first insulating layer 12 further covers on the gate electrode 13 to insulate the gate electrode 13 and the active layer 16 mutually.

The active layer 16 is disposed on the first insulating layer 12, and the active layer 16 is located directly above the gate electrode 13. The active layer 16 includes a source electrode contact region 161, a drain electrode contact region 163, and an active region 162. The source electrode contact region 161 and the drain electrode contact region 163 are spaced apart from each other, and the active region 162 connects the source electrode contact region 161 and the drain electrode contact region 163. The orthographic projection of the active region 162 on the plane where the gate electrode 13 is located within the gate electrode 13.

The source electrode 14 and the drain electrode 15 are also disposed on the first insulating layer 12, and part of the region of the source electrode 14 covers on the source electrode contact region 161, and forms ohmic contact with the source electrode contact region 161. Part of the region of the drain electrode 15 covers on the drain electrode contact region 163 and forms ohmic contact with the drain electrode contact region 163.

Figure 2:
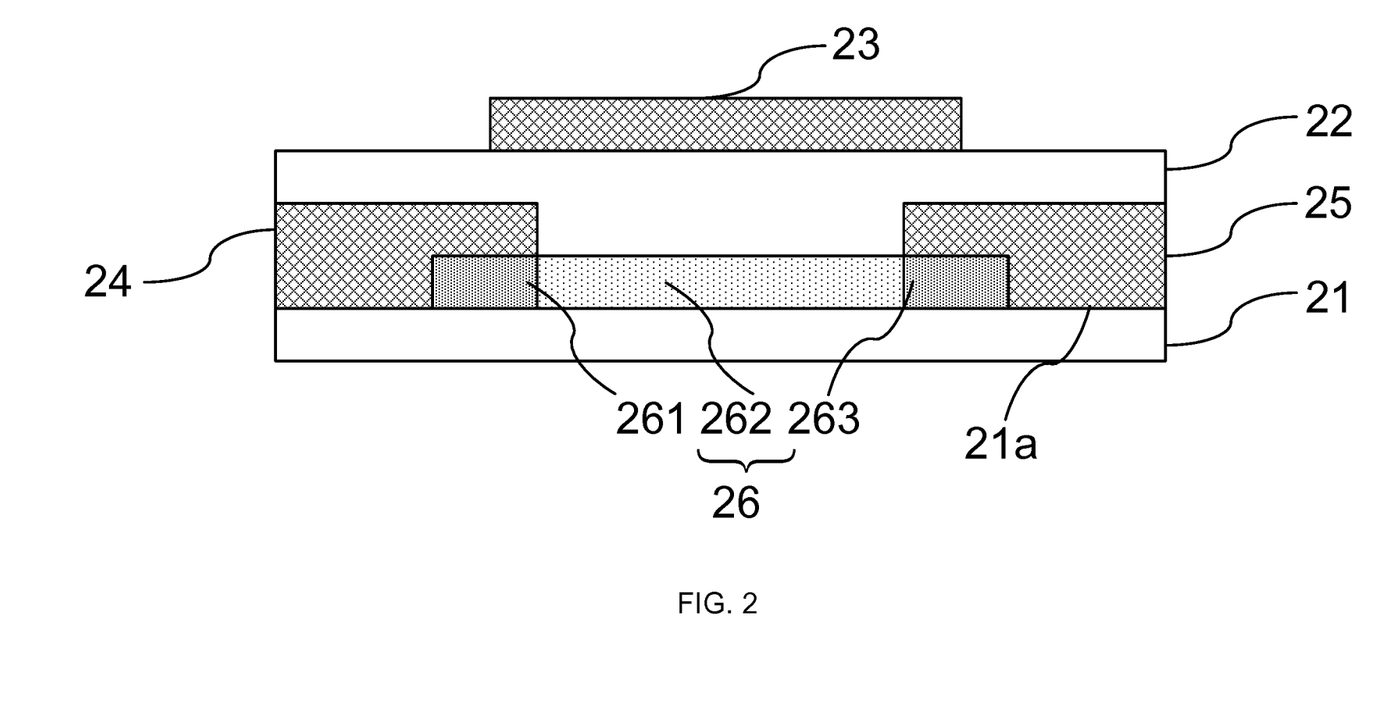
FIG. 2 is a schematic structural diagram of another thin film transistor according to the embodiments of the present disclosure.

FIG. 2 is a schematic structural diagram of another thin film transistor according to the embodiments of the present disclosure. The thin film transistor shown in FIG. 2 is different from the thin film transistor shown in FIG. 1 in that the thin film transistor shown in FIG. 1 is a bottom gate structure, that is, the gate electrode 13 is located between the active layer 16 and the substrate 11 in a direction perpendicular to the substrate 11. However, the thin film transistor shown in FIG. 2 is a top gate structure, that is, the active layer 26 of the thin film transistor is located between the gate electrode 23 and the substrate 21 in a direction perpendicular to the substrate 21.

As shown in FIG. 2, the active layer 26, the source electrode 24 and the drain electrode 25 are all disposed on the first surface 21a of the substrate 21, part of the region of the source electrode 24 covers on the source electrode contact region 261, and part of the region of the drain electrode 25 covers on the drain electrode contact region 263. A second insulating layer 22, on which a gate electrode 23 is disposed, covers on the active layer 26, the source electrode 24 and the drain electrode 25, and the gate electrode 23 is located directly above the active region 26.

Each of the first insulating layer 12 and the second insulating layer 22 can be any one or more of $SiN_x$, $SiON_x$, and $SiO_x$.

The active layers of the thin film transistors shown in FIG. 1 and FIG. 2 are both made of the CIGS material. The active layer in the thin film transistor of a double-gate structure can also be made of the CIGS material. The thin film transistor of the double-gate structure has two gate electrodes. Optionally, both the gate electrodes can locate below the active layer, for example, one gate electrode is added between the active layer 16 and the gate electrode 13 in FIG. 1. Or, both the gate electrodes can also locate above the active layer, for example, there is one more gate electrode above the gate electrode 23 in FIG. 2. Or, one of the two gate electrodes can locate below the active layer and the other of the two gate electrodes can locate above the active layer, for example, one gate electrode is added above the active layer 16 in FIG. 1 or one gate electrode is added below the active layer 26 in FIG. 2.

By manufacturing the active layer of the thin film transistor with the CIGS, and the crystal defects of the CIGS are less than the LTPS and IGZO, the mobility of the thin film transistor is higher (up to 300 $cm^2 \cdot V^{-1} \cdot s^{-1}$ or more), and the switching speed of the thin film transistor is faster, thereby being advantageous for further improving the resolution of the display device.

In one possible implementation manner, the copper content and the selenium content of the source electrode contact region, the drain electrode contact region, and the active region are all equal. That is, the copper content in each part of the active layer is equal, and the selenium content in each part of the active layer is equal. The indium contents and the gallium contents in the source electrode contact region, the drain electrode contact region, and the active region can be equal or unequal. In such implementation manner, the active layer is an intrinsic semiconductor and the thin film transistor can be a field effect transistor.

In another possible implementation manner, the copper content of the source electrode contact region and the copper content of the drain electrode contact region can be greater than the copper content of the active region, and the selenium content of the source electrode contact region, the drain electrode contact region, and the active region are all equal, that is, the source electrode contact region and the drain electrode contact region are copper-rich regions, and the selenium content in each part of the active layer is equal. At this time, the content of copper which as acceptor in the source electrode contact region and the drain electrode contact region are higher, and a p-type thin film transistor is obtained, which is suitable for the occasions where the p-type thin film transistor needs to be disposed. In the p-type thin film transistor, the indium contents and the gallium contents in the source electrode contact region, the drain electrode contact region, and the active region can be equal or unequal.

In another possible implementation manner, the selenium content of the source electrode contact region and the selenium content of the drain electrode contact region can be less than the selenium content of the active region, and the copper content of the source electrode contact region, the drain electrode contact region, and the active region are all equal, that is, the source electrode contact region and the drain electrode contact region are selenium-poor regions, and the copper content in each part of the active layer is equal. At this time, the content of selenium which as donor in the active region is higher, and an n-type thin film transistor is obtained, which is suitable for the occasions where the n-type thin film transistor needs to be disposed. In the n-type thin film transistor, the indium contents and the gallium contents in the source electrode contact region, the drain electrode contact region, and the active region can be equal or unequal.

Optionally, the thickness of the active layer can be 300 A to 1800 A.

Exemplarily, both the substrate 11 and the substrate 21 can be a transparent substrate, such as a base substrate and a glass substrate and so on.

Optionally, the gate electrode can adopt Cu, Al, Ti, Mo or a Mo-based composite material, and the Mo-based composite material can be AlNd/Mo (i.e., formed by laminating an AlNd layer and an Mo layer) or Mo/AlNd/Mo (i.e., formed by laminating by an Mo layer, an AlNd layer and an Mo layer). The Mo and Mo-based composite material have better thermal stability, stable physical and chemical properties, and relatively low electric resistivity. The thickness of the gate electrode can be 2000 A-4000 A.

Optionally, both the source electrode and the drain electrode contain Cu. Exemplarily, both the source electrode and the drain electrode can be made of Cu, a Cu alloy or a Cu-based composite material, and the Cu-based composite material can be Cu/MoNd (i.e., formed by laminating a Cu layer and an MoNd layer). The Cu, the Cu alloy and the Cu-based composite material have better thermal stability, stable physical and chemical properties, and relatively low electric resistivity. The Cu in the source electrode and the drain electrode is favorable for the improvement of the copper content in the regions of the active layer in contact with the source electrode and the drain electrode in the subsequent process, and the p-type thin film transistor is convenient to manufacture. The thicknesses of the source electrode and the drain electrode can be 2000 A to 4000 A.

Figure 3:
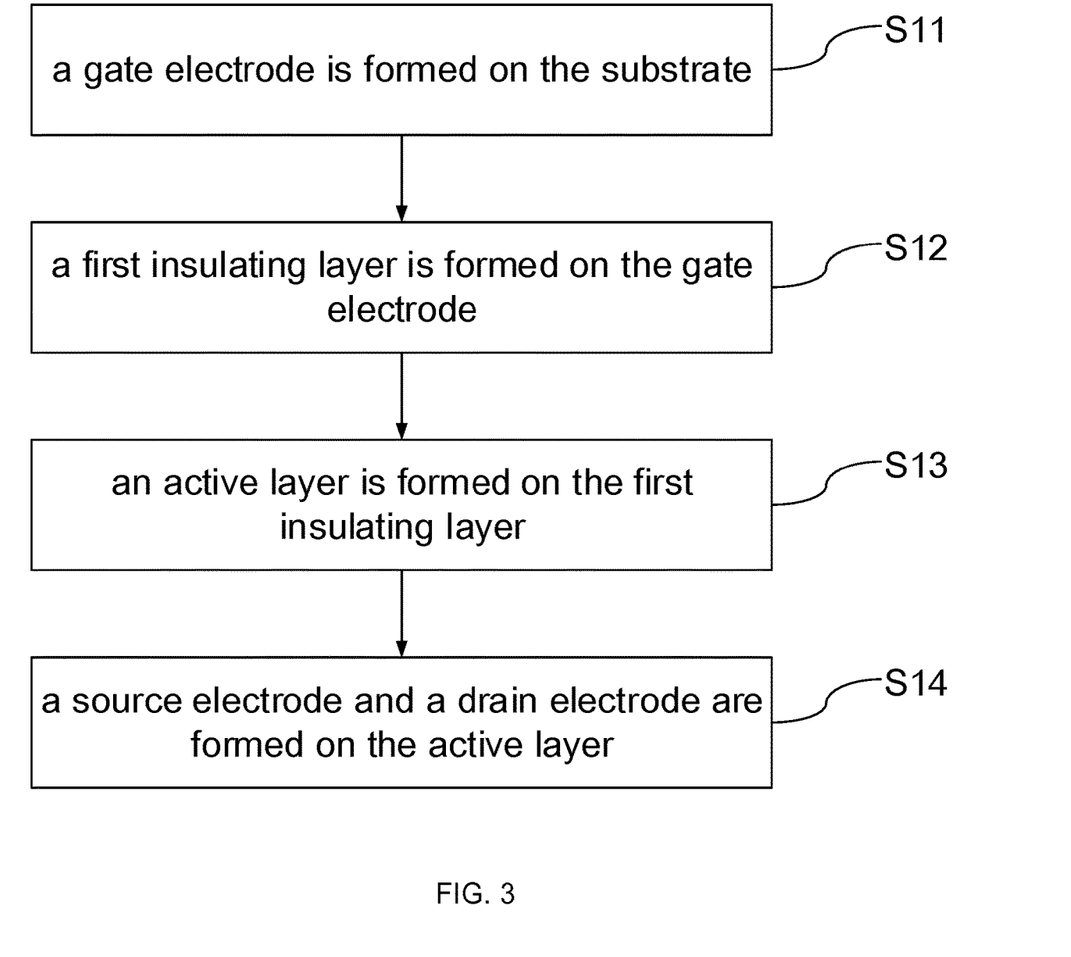
FIG. 3 is a flowchart of a manufacturing method for a thin film transistor according to the embodiments of the present disclosure.

FIG. 3 is a flowchart of a manufacturing method for a thin film transistor according to the embodiments of the present disclosure. The method can be configured to manufacture the thin film transistor of the bottom gate structure shown in FIG. 1. As shown in FIG. 3, the manufacturing method includes the following steps.

In step S11: a gate electrode is formed on the substrate.

Figure 4:
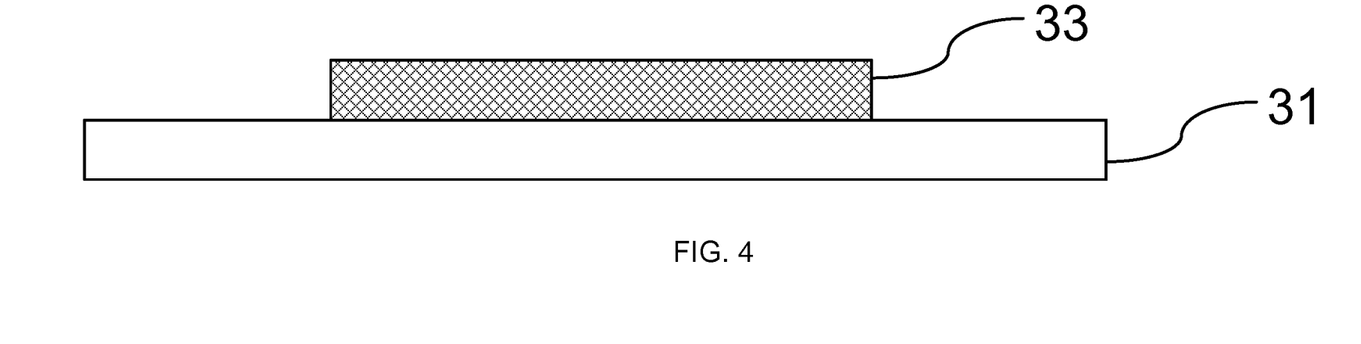
FIG. 4 to FIG. 6 are schematic diagrams of a manufacturing process for a thin film transistor according to the embodiments of the present disclosure.

As shown in FIG. 4, a gate electrode 33 is formed on the substrate 31.

Exemplarily, the substrate 31 can be a transparent substrate, such as a glass substrate and so on.

Forming the gate electrode 33 can include the following steps.

In step 1: a gate electrode material film layer is formed on the substrate.

Optionally, the gate electrode material film layer can be Cu, Al, Ti, Mo or a Mo-based composite material, and the Mo-based composite material can be AlNd/Mo or Mo/AlNd/Mo. The Mo and the Mo-based composite material have better thermal stability and stable physical and chemical properties, and have relatively low electric resistivity.

The gate electrode material film layer can be manufactured by, for example, a PVD (Physical Vapor Deposition) method.

The thickness of the gate electrode material film layer can be 2000 A to 4000 A.

In step 2: the gate electrode material film layer is patterned to manufacture the gate electrode.

Patterning the gate electrode material film layer can include performing the following operations on the gate electrode material film layer in sequence: coating photoresist, exposing, developing and etching. The patterning process can be the same as the conventional patterning process, and is not repeated in detail here.

In step S12: a first insulating layer is formed on the gate electrode.

Figure 5:
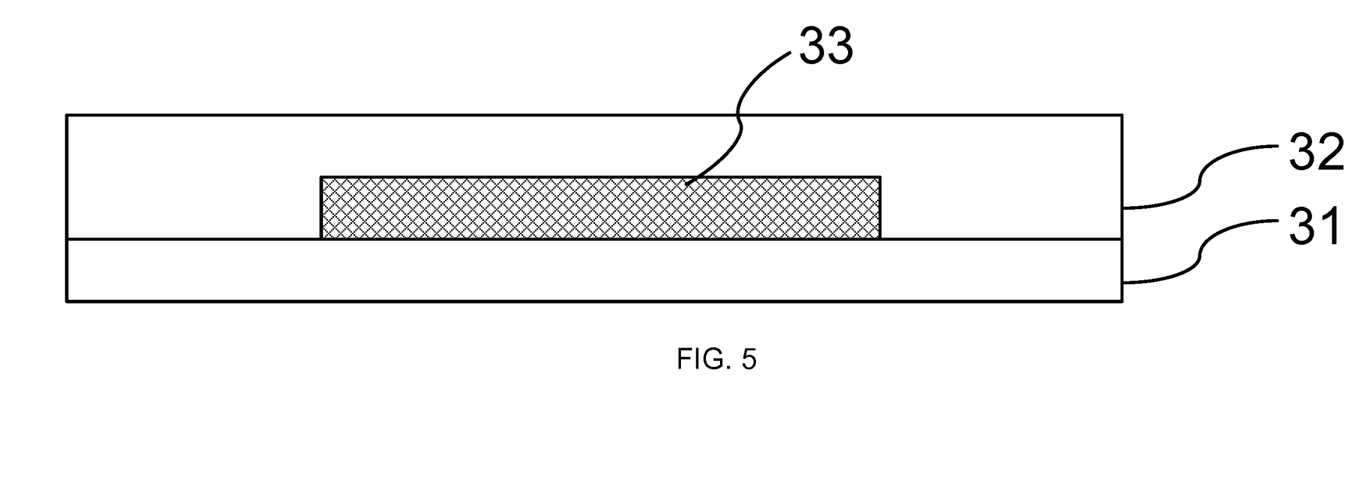

As shown in FIG. 5, the first insulating layer 32 covers on the gate electrode 33.

The first insulating layer 32 can be any one or more of $SiN_x$, $SiON_x$, and $SiO_x$. The $SiN_x$, $SiON_x$, and $SiO_x$ have good insulating property and the materials are transparent, thereby enabling the manufactured thin film transistor to be more suitable for use in a display device, such as a display panel and so on.

The first insulating layer 32 can also be manufactured by the PVD method.

In step S13: an active layer is formed on the first insulating layer.

Wherein, the active layer is made of a CIGS material.

Figure 6:
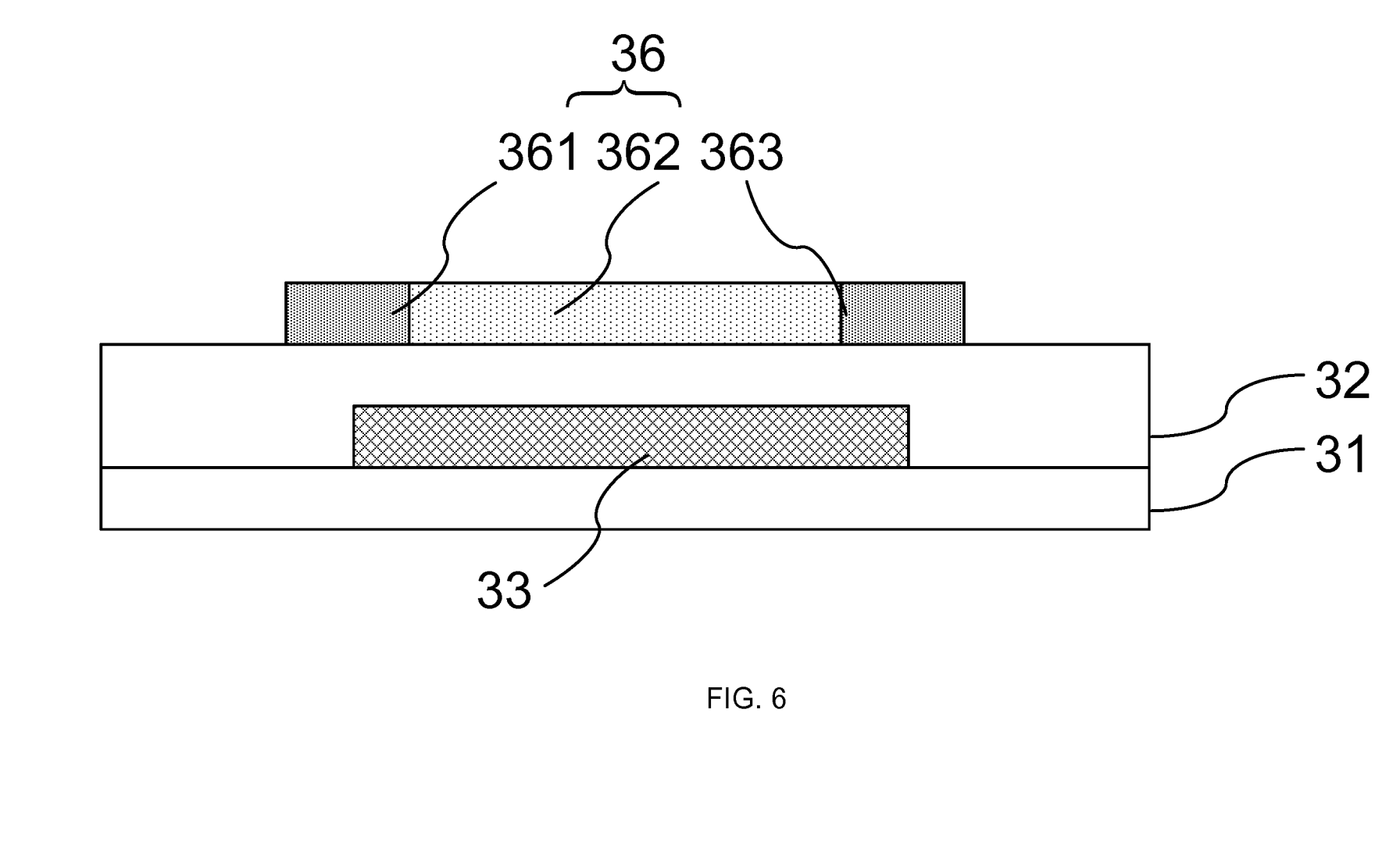

As shown in FIG. 6, an active layer 36 is formed on the first insulating layer 32, wherein the active layer 36 includes a source electrode contact region 361 and a drain electrode contact region 363 which are spaced apart from each other and an active region 362 connecting the source electrode contact region 361 and the drain electrode contact region 363. The source electrode contact region 361 and the drain electrode contact region 363 are respectively configured to be in contact with the source electrode and the drain electrode which are manufactured in the subsequent steps.

Manufacturing the active layer can include the following steps.

In step 1: a CIGS film layer is formed on the substrate on which the first insulating layer is formed.

Exemplarily, the CIGS film layer can be manufactured on the first insulating layer by magnetron sputtering with copper (Cu), indium (In), gallium (Ga), and selenium (Se) as target materials.

Optionally, the thickness of the formed CIGS film layer can be 300 A to 1800 A.

In step 2: the CIGS film layer is patterned to obtain the active layer.

Step 2 can include performing coating photoresist, exposing, developing, and etching on the CIGS film layer in sequence. The patterning process can be the same as the conventional patterning process, which is not repeated in detail here.

In step S14: a source electrode and a drain electrode are formed on the active layer.

The structure after the source electrode and the drain electrode are formed on the active layer can refer to FIG. 1.

Manufacturing the source electrode and the drain electrode can include the following steps.

In step 1: a source-drain electrode material film layer is formed on the first insulating layer and the active layer.

Optionally, the source-drain electrode material can be Cu, a Cu alloy or a Cu-based composite material, and the Cu-based composite material can be Cu/MoNd. The Cu, the Cu alloy and the Cu-based composite material have better thermal stability and stable physical and chemical properties, and relatively low electric resistivity. The Cu in the source-drain electrode material film layer is favorable for the improvement of the copper content in the regions of the active layer in contact with the source electrode and the drain electrode in the subsequent process, and the p-type thin film transistor is convenient to manufacture.

The source-drain electrode material film layer can also be manufactured by the PVD method.

In step 2: the source-drain electrode material film layer is patterned to form the source electrode and the drain electrode.

Step 2 can include performing coating photoresist, exposing, developing, and etching on the source-drain electrode material film layer in sequence. The patterning process can be the same as the conventional patterning process, which is not repeated in detail here.

By etching, the source electrode and the drain electrode which are mutually separated are formed, part of the region of the source electrode covers on part of the region of the active layer, and part of the region of the drain electrode covers on the other part of the region of the active layer. After etching, the active region of the active layer connected between the source electrode contact region and the drain electrode contact region is exposed. The orthographic projection of the active region on the plane where the gate electrode is located within the gate electrode.

In the active layer of the thin film transistor manufactured by the above method, the copper content of the source electrode contact region is equal to the copper content of the drain electrode contact region, and the selenium content of the source electrode contact region is equal to the selenium content of the drain electrode contact region. At this time, the active layer can be an intrinsic semiconductor, and is suitable for the occasions where a field effect transistor needs to be disposed.

When the thin film transistor shown in FIG. 1 is the p-type thin film transistor, both the source electrode and the drain electrode manufactured in step S14 contain copper. After S14, the manufacturing method can further include the following step.

The substrate on which the source electrode and the drain electrode are formed is annealed to make the copper in the source electrode diffuse to the source electrode contact region and make the copper in the drain electrode diffuse to the drain electrode contact region.

Exemplarily, the annealing can be performed under a nitrogen atmosphere, the annealing temperature can be 400° C. to 600° C., and the annealing time can be 30 min to 90 min. By annealing the substrate on which the source electrode and the drain electrode are formed, the copper is thermally diffused at a higher temperature, the copper in the source electrode diffuses to the source electrode contact region, and the copper in the drain electrode diffuses to the drain electrode contact region. The thermal motion of indium is intensified at the higher temperature, and part of the indium will depart from the original lattice positions and leave the vacancies to be replaced by the copper, thereby increasing the copper content in the source electrode contact region and the drain electrode contact region, and causing the copper content in the source electrode contact region and the drain electrode contact region to be greater than the copper content in the active region. After annealing, the source electrode contact region and the drain electrode contact region become copper-rich regions, and the content of copper which as the acceptor in the source electrode contact region and the drain electrode contact region are relatively high, thereby manufacturing the p-type thin film transistor, which is suitable for the occasions where the p-type thin film transistor needs to be disposed.

Optionally, before step S14, the manufacturing method can further include the following step.

The active layer is selenized.

Exemplarily, the active layer can be selenized in a selenization furnace, including but not limited to the manners such as gas selenization (for example, adopting hydrogen selenide) and solid selenization (for example, adopting solid selenium) and so on.

The selenium in the CIGS film layer is relatively easy to volatilize. The selenium content of the CIGS film layer manufactured in S13 is relatively low. By selenizing the CIGS film layer before S14, the selenium content in the CIGS film layer can be improved, thereby improving the properties of the CIGS film layer, and enabling the thin film transistor to have higher mobility.

When the thin film transistor shown in FIG. 1 is an n-type thin film transistor, after S14, the manufacturing method can further include the following step.

The active region is selenized.

The selenium content of the CIGS film layer manufactured in S13 is relatively low. By selenizing the CIGS film layer after S14, the selenium content in the active region can be improved, thereby improving the properties of the active region and enabling the thin film transistor to have higher mobility. Meanwhile, since the source electrode and the drain electrode have been manufactured in the source electrode contact region and the drain electrode contact region, and only the selenium content in the exposed active region is increased after the selenization treatment, while the selenium content in the source electrode contact region and the drain electrode contact region remain unchanged, the selenium content in the source electrode contact region and the drain electrode contact region are less than the selenium content in the active region. After the selenization treatment, the source electrode contact region and the drain electrode contact region become selenium-poor regions, and the content of selenium which as a donor in the active region is relatively high, thereby manufacturing the n-type thin film transistor, which is suitable for the occasions where the n-type thin film transistor needs to be disposed.

Figure 7:
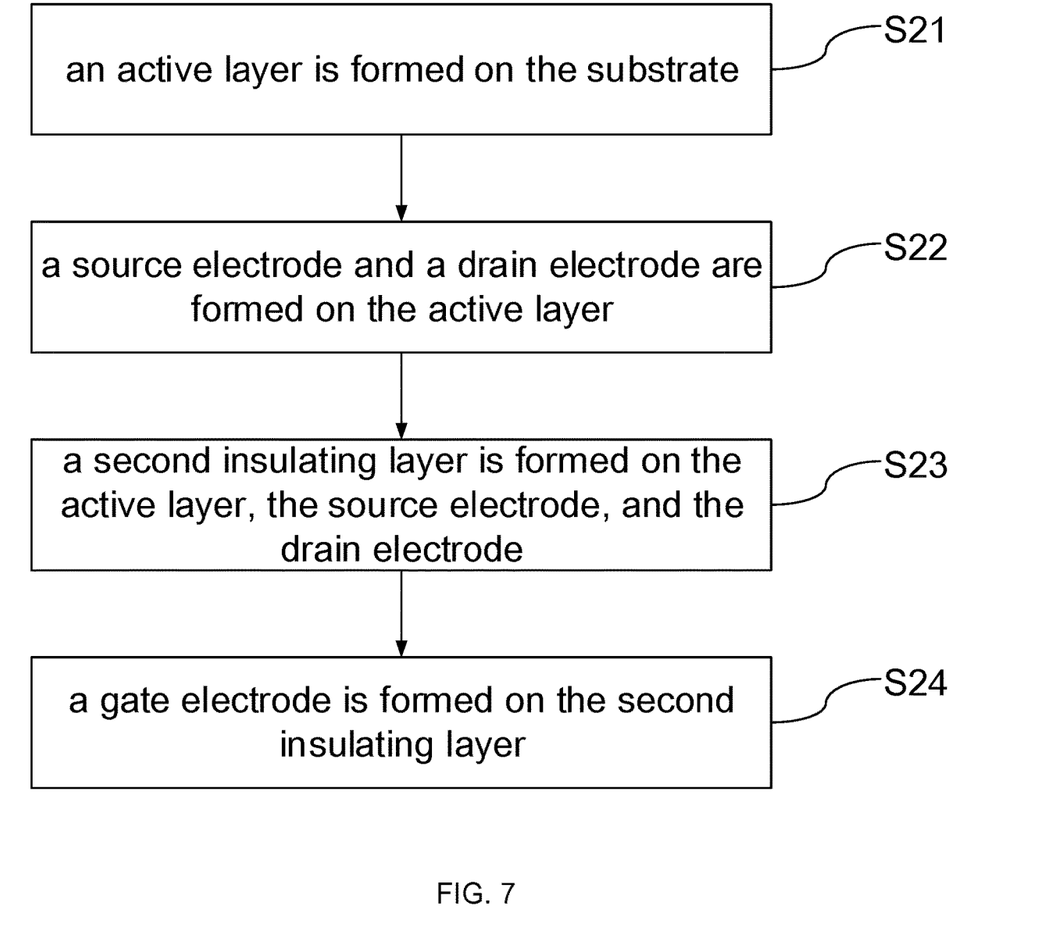
FIG. 7 is a flowchart of a manufacturing method for a thin film transistor according to the embodiments of the present disclosure.

FIG. 7 is a flowchart of a manufacturing method for a thin film transistor according to the embodiments of the present disclosure. The method can be configured to manufacture the thin film transistor of the top gate structure shown in FIG. 2. As shown in FIG. 7, the manufacturing method includes the following steps.

In step S21: an active layer is formed on the substrate.

Wherein, the active layer is made of a CIGS material.

Figure 8:
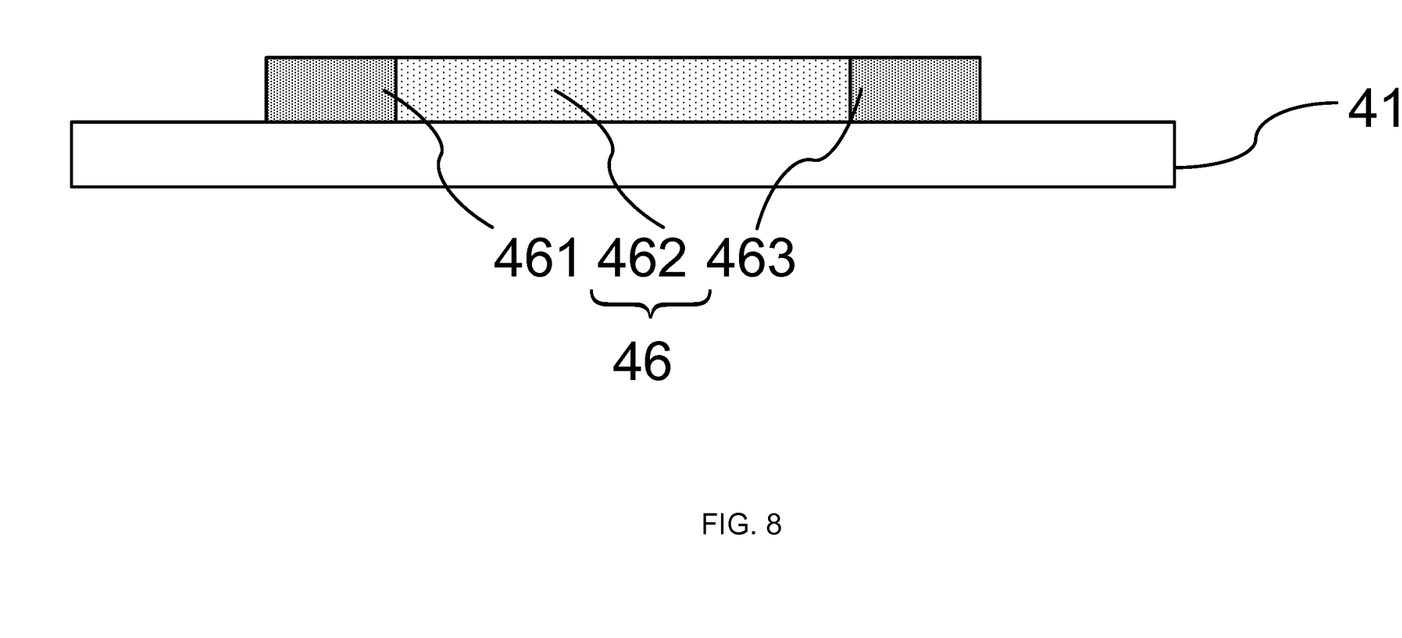
FIG. 8 to FIG. 10 are schematic diagrams of a manufacturing process for another thin film transistor according to the embodiments of the present disclosure.

As shown in FIG. 8, an active layer 46 is formed on the substrate 41, wherein the active layer 46 includes a source electrode contact region 461 and a drain electrode contact region 463 which are spaced apart from each other and an active region 462 connecting the source electrode contact region 461 and the drain electrode contact region 463. The source electrode contact region 461 and the drain electrode contact region 463 are respectively configured to be in contact with the source electrode and the drain electrode which are manufactured in the subsequent steps.

Optionally, the substrate can be a transparent substrate such as a base substrate and a glass substrate and so on.

Manufacturing the active layer can include the following steps.

In step 1: a CIGS film layer is formed on the substrate.

Exemplarily, the CIGS film layer can be formed on the first insulating layer by magnetron sputtering with copper (Cu), indium (In), gallium (Ga), and selenium (Se) as target materials.

Optionally, the thickness of the formed CIGS film layer can be 300 A to 1800 A.

In step 2: the CIGS film layer is patterned to obtain the active layer.

Step 2 can include performing coating photoresist, exposing, developing, and etching on the CIGS film layer in sequence. The patterning process can be the same as the conventional patterning process, which is not repeated in detail here.

In step S22: a source electrode and a drain electrode are formed on the active layer.

Figure 9:
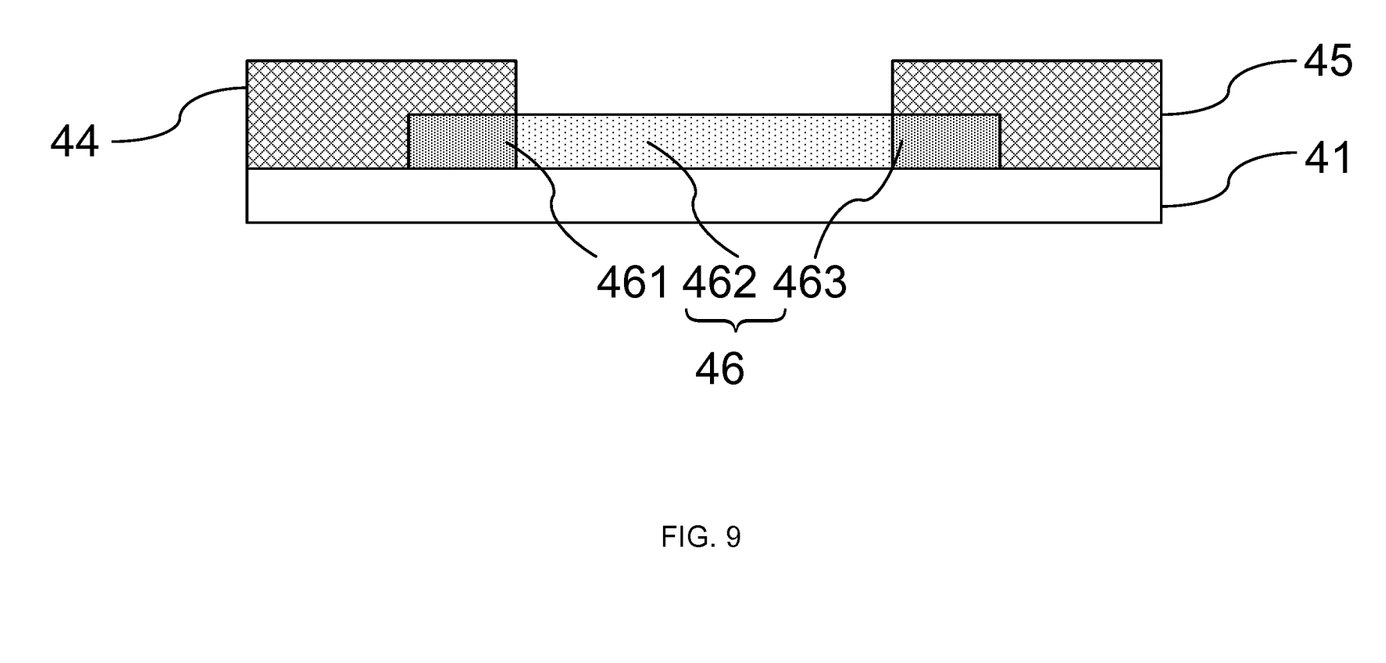

As shown in FIG. 9, part of the region of the source electrode 44 covers on the source electrode contact region 461, and part of the region of the drain electrode 45 covers on the drain electrode contact region 463.

Step S22 can be the same as step S14 described above, and is not repeated in detail here.

In step S23: a second insulating layer is formed on the active layer, the source electrode, and the drain electrode.

Figure 10:
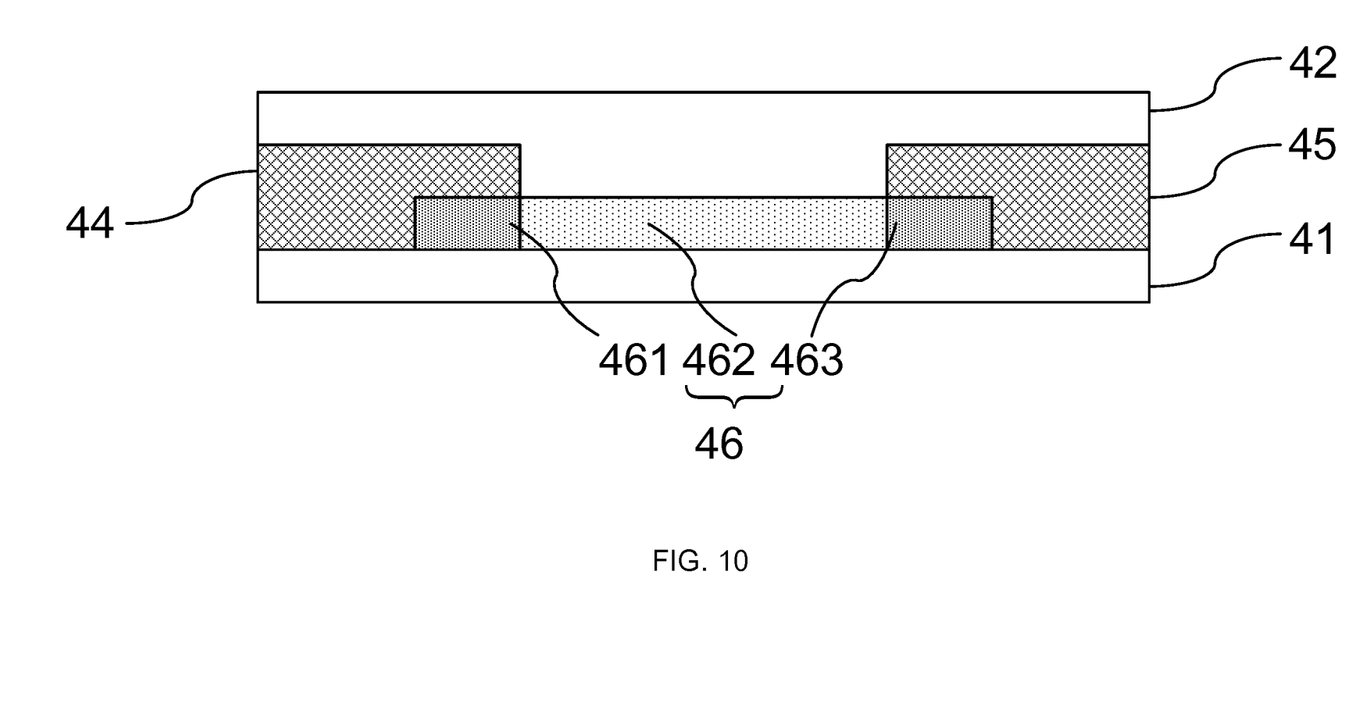

As shown in FIG. 10, the second insulating layer 42 covers on the active layer 46, the source electrode 44, and the drain electrode 45.

The second insulating layer can be any one or more of $SiN_x$, $SiON_x$, and $SiO_x$. The $SiN_x$, $SiON_x$, and $SiO_x$ have good insulating property and the materials are transparent, thereby enabling the manufactured thin film transistor to be more suitable for use in a display device such as a display panel and so on.

The second insulating layer can also be manufactured by the PVD method.

In step S24: a gate electrode is formed on the second insulating layer.

The structure after the gate electrode is formed can refer to FIG. 2.

Step S24 can be the same as step S11 described above, and is not repeated in detail here.

In the active layer of the thin film transistor manufactured by the above method, the copper content of the source electrode contact region and the copper content of the drain electrode contact region are equal, and the selenium content of the source electrode contact region and the selenium content of the drain electrode contact region are equal, and at this time, the CIGS is an intrinsic semiconductor material.

When the thin film transistor shown in FIG. 2 is a p-type thin film transistor, both the source electrode and the drain electrode which are manufactured in step S22 contain copper. After S22, the manufacturing method can further include the following step.

The substrate on which the source electrode and the drain electrode are formed is annealed to make the copper in the source electrode diffuse to the source electrode contact region and to make the copper in the drain electrode diffuse to the drain electrode contact region.

This process is the same as the above annealing process when the p-type thin film transistor of the structure shown in FIG. 1 is manufactured, and will not be repeated in detail here.

Optionally, before step S22, the manufacturing method can further include the following step.

The active layer is selenized.

This process is the same as the above selenization process when the p-type thin film transistor of the structure shown in FIG. 1 is manufactured, and will not be repeated in detail here.

When the thin film transistor shown in FIG. 2 is an n-type thin film transistor, after S22, the manufacturing method can further include the following step.

The active region is selenized.

This process is the same as the selenization process when the n-type thin film transistor of the structure shown in FIG. 1 is manufactured, and will not be repeated in detail here.

The embodiments of the present disclosure further provide an array substrate. The array substrate includes a thin film transistor, and an active layer of the thin film transistor is made of a CIGS material.

Exemplarily, the array substrate includes a substrate and a plurality of thin film transistors disposed on the substrate, and the plurality of thin film transistors at least include any one above thin film transistor.

Optionally, the plurality of thin film transistors can include at least one of the thin film transistor of the bottom gate structure shown in FIG. 1, the thin film transistor of the top gate structure shown in FIG. 2, and the thin film transistor of the double-gate structure. The plurality of thin film transistor can include an n-type thin film transistor or a p-type thin film transistor, or can include a thin film transistor of which the active layer is made of a CIGS intrinsic semiconductor material.

Optionally, the array substrate can further include a plurality of gate lines, and the plurality of gate lines are disposed in parallel on the substrate at an interval. Each of the gate lines connects with a plurality of thin film transistors, so that the ON and OFF of the plurality of thin film transistors are simultaneously controlled by the gate lines. Exemplarily, the gate electrodes of the thin film transistors can connect with the gate lines, and in addition, parts of the gate lines can be configured as the gate electrodes.

Figure 11:
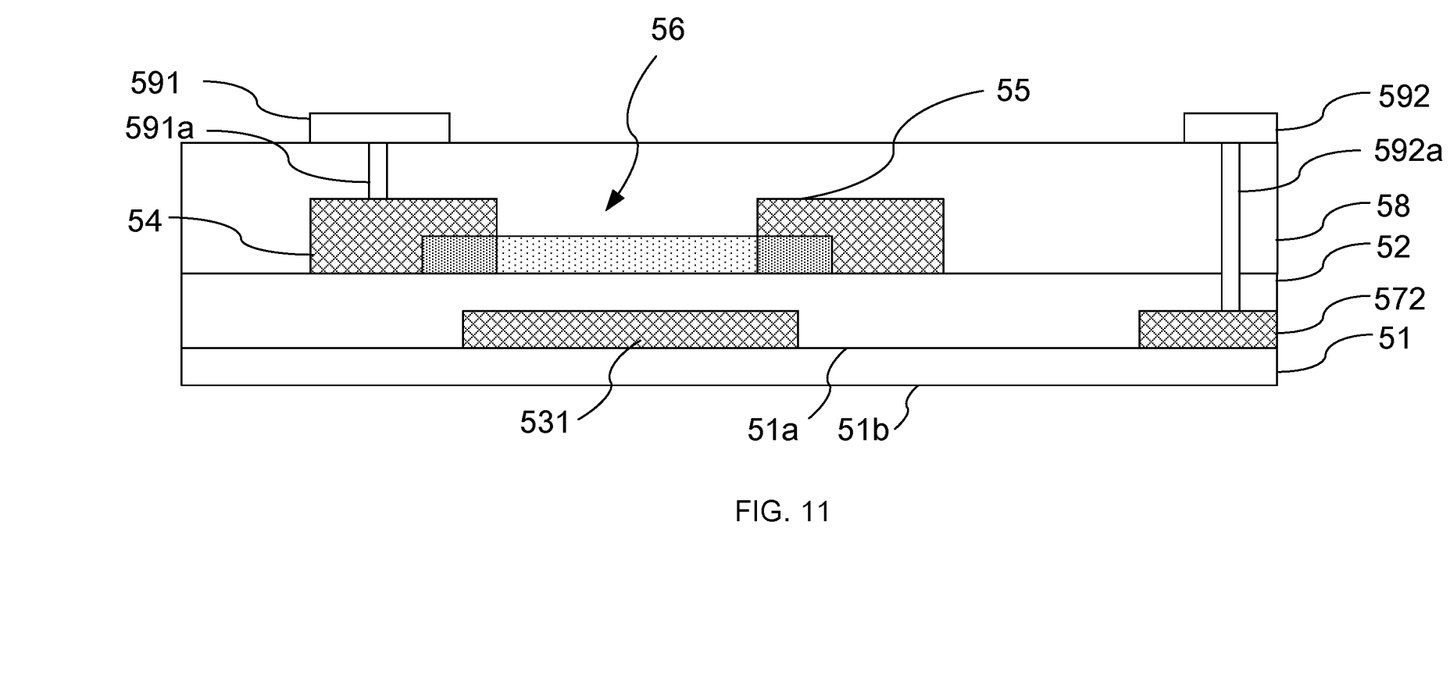
FIG. 11 is a partial schematic structural diagram of an array substrate according to the embodiments of the present disclosure.

FIG. 11 is a partial schematic structural diagram of an array substrate according to the embodiments of the present disclosure. As shown in FIG. 11, a thin film transistor is disposed on a substrate 51. The substrate 51 has a first surface 51a and a second surface 52b which are opposite to each other, and the thin film transistor is disposed on the first surface 51a. A gate line 531 is on the first surface 51a. A first insulating layer 52 covers on the layer on which the gate line 531 and a common electrode line 572 are located. The active layer 56, a source electrode 54 and a drain electrode 55 of the thin film transistor are disposed on the first insulating layer 52, and the active layer 56 is located directly above the gate line 531.

Exemplarily, in the embodiment shown in FIG. 11, a part of the gate line can serve as the gate electrode of the thin film transistor, or the gate electrode of the thin film transistor can also be a separate part connected with the gate line.

A passivation layer 58 also covers on the layer on which the active layer 56, the source electrode 54 and the drain electrode 55 are located. The passivation layer 58 can be any one or more of $SiN_x$, $SiON_x$, and $SiO_x$.

A pixel electrode 591 can also be disposed on the passivation layer 58. Wherein, the pixel electrode 591 can connect with one of the source electrode 54 or the drain electrode 55 of the thin film transistor by a through hole 591*a* (the present embodiment takes the connection between the pixel electrode 591 and the source electrode 54 as an example).

Optionally, the array substrate shown in FIG. 11 further includes the common electrode line 572. The common electrode line 572 can be disposed in the same layer as the gate line 531 and disposed in a direction parallel to the substrate 51. The common electrode line 572 connects with the common electrode 592 by the through hole 592*a*.

Both the pixel electrode 591 and the common electrode 592 can be made of a transparent conductive material, such as ITO (Indium tin oxide).

It should be noted that the structure of the array substrate shown in FIG. 11 is only an example. In actual arrangement, the array substrate can further include other structures, for example, can further include multiple data lines, and the data lines can connect with one of the source electrode or the drain electrode of the thin film transistor. In addition, although the pixel electrode 591 is disposed in the same layer as the common electrode 592 in FIG. 11, in other embodiments, the common electrode of the array substrate can also locate on a different layer from the pixel electrode, or the common electrode can also locate on the opposed substrate of the array substrate (such as a color filter substrate), which is not limited by the present disclosure.

It should be noted that the number and the sequence of the film layers of the array substrate shown in FIG. 11 are also merely examples. In other embodiments, more film layers (such as a buffer layer) or fewer layers can be included, or the sequence of some film layers can be exchanged.

The embodiments of the present disclosure further provide a display device, which can include any one of the above array substrate.

The display device can be a liquid crystal display device or an organic light-emitting diode display device.

The display device provided in the embodiments of the present disclosure can be a mobile phone, a tablet computer, a TV, a display, a laptop computer, a digital photo frame, a navigator, or any other product or component with a display function.

The foregoing descriptions are merely exemplary embodiments of the present disclosure, and are not intended to limit the present disclosure. Within the spirit and principles of the disclosure, any modifications, equivalent substitutions, improvements, etc., are within the protection scope of the appended claims of the present disclosure.

What is claimed is:

1. A thin film transistor, wherein an active layer of the thin film transistor is made of a Cu—In—Ga—Se (CIGS) material; and
    wherein the active layer of the thin film transistor comprises a source electrode contact region in contact with a source electrode, a drain electrode contact region in contact with a drain electrode, and an active region connecting the source electrode contact region and the drain electrode contact region; a selenium content of the source electrode contact region and a selenium content of the drain electrode contact region are less than a selenium content of the active region; and a copper content of the source electrode contact region, the drain electrode contact region and the active region are all equal.

2. The thin film transistor according to claim 1, wherein the active layer of the thin film transistor comprises a source electrode contact region in contact with a source electrode, a drain electrode contact region in contact with a drain electrode, and an active region connecting the source electrode contact region and the drain electrode contact region; and a copper content and a selenium content of the source electrode contact region, the drain electrode contact region and the active region are all equal.

3. The thin film transistor according to claim 1, wherein the active layer of the thin film transistor comprises a source electrode contact region in contact with a source electrode, a drain electrode contact region in contact with a drain electrode, and an active region connecting the source electrode contact region and the drain electrode contact region; a copper content of the source electrode contact region and a copper content of the drain electrode contact region are greater than a copper content of the active region; and a selenium content of the source electrode contact region, the drain electrode contact region and the active region are all equal.

4. The thin film transistor according to claim 3, wherein both the source electrode and the drain electrode contain copper.

5. The thin film transistor according to claim 4, wherein both the source electrode and the drain electrode are made of one of the following materials: copper, a copper alloy, and a copper-based composite material.

6. The thin film transistor according to claim 1, wherein a gate electrode of the thin film transistor is made of one of the following materials: copper, aluminum, titanium, molybdenum or a molybdenum-based composite material.

7. A manufacturing method for a thin film transistor, comprising:
    forming a CIGS film layer on a substrate; and
    patterning the CIGS film layer to obtain an active layer; and
    wherein the active layer comprises a source electrode contact region, a drain electrode contact region, and an active region connecting the source electrode contact region and the drain electrode contact region; and
    the manufacturing method further comprises:
    forming a source electrode and a drain electrode on the active layer, part of the region of the source electrode covering on the source electrode contact region, and part of the region of the drain electrode covering on the drain electrode contact region; and
    selenizing the active region; and
    wherein a selenium content of the source electrode contact region and a selenium content of the drain electrode contact region are less than a selenium content of the active region; and a copper content of the source electrode contact region, the drain electrode contact region and the active region are all equal.

8. The manufacturing method according to claim 7, wherein the active layer comprises a source electrode contact region, a drain electrode contact region, and an active region connecting the source electrode contact region and the drain electrode contact region; and
    the manufacturing method further comprises:
    forming a source electrode and a drain electrode on the active layer, the source electrode and the drain electrode containing copper, part of the region of the source electrode covering on the source electrode contact region, and part of the region of the drain electrode covering on the drain electrode contact region; and annealing the substrate on which the source electrode and the drain electrode are formed, so that the copper in the source electrode diffuses to the source electrode contact region and the copper in the drain electrode diffuses to the drain electrode contact region.

9. The manufacturing method according to claim 8, wherein the annealing temperature of the annealing treatment is 400° C. to 600° C.

10. The manufacturing method according to claim 8, wherein the manufacturing method further comprises:

selenizing the active layer before the source electrode and the drain electrode are formed on the active layer.

11. An array substrate, comprising a thin film transistor, wherein an active layer of the thin film transistor is made of a CIGS material; and wherein the active layer of the thin film transistor comprises a source electrode contact region in contact with a source electrode, a drain electrode contact region in contact with a drain electrode, and an active region connecting the source electrode contact region and the drain electrode contact region; a selenium content of the source electrode contact region and a selenium content of the drain electrode contact region are less than a selenium content of the active region; and a copper content of the source electrode contact region, the drain electrode contact region and the active region are all equal.

12. The array substrate according to claim 11, wherein the active layer of the thin film transistor comprises a source electrode contact region in contact with a source electrode, a drain electrode contact region in contact with a drain electrode, and an active region connecting the source electrode contact region and the drain electrode contact region; and a copper content and a selenium content of the source electrode contact region, the drain electrode contact region and the active region are all equal.

13. The array substrate according to claim 11, wherein the active layer of the thin film transistor comprises a source electrode contact region in contact with a source electrode, a drain electrode contact region in contact with a drain electrode, and an active region connecting the source electrode contact region and the drain electrode contact region; a copper content of the source electrode contact region and a copper content of the drain electrode contact region are greater than a copper content of the active region; and a selenium content of the source electrode contact region, the drain electrode contact region and the active region are all equal.

14. The array substrate according to claim 13, wherein both the source electrode and the drain electrode of the thin film transistor contain copper.

15. The array substrate according to claim 14, wherein both the source electrode and the drain electrode are made of one of the following materials: copper, a copper alloy, and a copper-based composite material.

16. The array substrate according to claim 11, wherein a gate electrode of the thin film transistor is made of one of the following materials: copper, aluminum, titanium, molybdenum or a molybdenum-based composite material.

17. A display device, comprising the array substrate according to claim 11.

\* \* \* \* \*